United States Patent [19]
Cook, Jr.

[11] Patent Number: 5,237,867
[45] Date of Patent: Aug. 24, 1993

[54] THIN-FILM AIR FLOW SENSOR USING TEMPERATURE-BIASING RESISTIVE ELEMENT

[75] Inventor: Charles R. Cook, Jr., Williamsburg, Va.

[73] Assignee: Siemens Automotive L.P., Auburn Hills, Mich.

[21] Appl. No.: 546,477

[22] Filed: Jun. 29, 1990

[51] Int. Cl.$^5$ .............................................. G01F 1/68
[52] U.S. Cl. ........................... 73/204.15; 73/204.18; 73/204.26
[58] Field of Search ........... 73/204.15, 204.16, 204.18, 73/204.19, 204.26

[56] References Cited

U.S. PATENT DOCUMENTS

| | | | |
|---|---|---|---|
| 3,623,364 | 11/1971 | Withrow | 73/204 |
| 3,992,940 | 11/1976 | Platzer, Jr. | 73/204 |
| 4,135,396 | 1/1979 | Stanke et al. | 73/204 |
| 4,214,478 | 7/1980 | Lauterbach | 73/204.26 |
| 4,244,217 | 1/1981 | Ledbetter | 73/204 |
| 4,283,944 | 8/1981 | Gruner et al. | 73/204 |
| 4,399,697 | 8/1983 | Kohama et al. | 73/204.16 |
| 4,468,963 | 9/1984 | Schauble | 73/204.16 |
| 4,471,647 | 9/1984 | Jerman et al. | 73/23 |
| 4,478,076 | 10/1984 | Bohrer | 73/204 |
| 4,501,144 | 2/1985 | Higashi et al. | 73/204 |
| 4,548,077 | 10/1985 | van Putten | 73/204 |
| 4,566,320 | 1/1986 | Bohrer | 73/204 |
| 4,587,842 | 5/1986 | Handtmann | 73/204 |
| 4,596,140 | 6/1986 | Dorman et al. | 73/204 |
| 4,624,138 | 11/1986 | Ono et al. | 73/204 |
| 4,637,253 | 1/1987 | Sekimura et al. | 73/189 |
| 4,672,847 | 6/1987 | Uchiyama et al. | 73/204 |
| 4,680,963 | 7/1987 | Tabata et al. | 73/204 |
| 4,682,496 | 7/1987 | Miura et al. | 73/204.16 |
| 4,688,424 | 8/1987 | Handtmann | 73/204.16 |
| 4,733,559 | 3/1988 | Aine et al. | 73/195 |
| 4,909,078 | 3/1990 | Sittler | 73/204.26 |

Primary Examiner—Herbert Goldstein
Attorney, Agent, or Firm—Russel C. Wells; George L. Boller

[57] ABSTRACT

Two discrete self-heating elements are provided in a silicon based sensor structure. The first, "transfer" self-heating element receives constant current and elevates the temperature of the sensor structure to a desired initial temperature above ambient. The second, "sensor" self-heating element is thermally coupled to the first element and receives a current adjusted based on the difference between ambient temperature and the sensor structure temperature so as to maintain a constant temperature difference. Most of the current flowing through the sensor heating element is thus attributable to fluid flow, and this current can therefore be conveniently used to determine fluid flow parameters (e.g., mass air flow). The elements may comprise thin films which may be interlaced or stacked vertically.

3 Claims, 10 Drawing Sheets

FIG. 2 SIMPLIFIED SCHEMATIC OF FLOW CIRCUIT

FIG. 5 INTERLACED (OR JUXTAPOSED) STRUCTURE

FIG. 7 STACKED STRUCTURE

THIN-FILM AIR FLOW SENSOR USING TEMPERATURE-BIASING RESISTIVE ELEMENT

CROSS-REFERENCES TO RELATED APPLICATIONS

This application is related to commonly-assigned U.S. Pat. No. 4,884,443 entitled "Control and Detection Circuitry for Mass Airflow Sensors", by Lee et al. and issued on Dec. 5, 1989.

The following commonly assigned patent applications may also be related:

U.S. Pat. No. 4,864,724, issued on Sep. 12, 1989, and entitled "Planar Mounting of Silicon Micromachined Sensors for Pressure and Fluid-Flow Measurement" by Bergstrom.

U.S. Pat. No. 4,870,745 issued on Oct. 3, 1989, and entitled "Methods of Making Silicon-Based Sensors" by Lee.

U.S. Pat. No. 4,888,988, issued on Dec. 26, 1989, and entitled "Silicon Based Mass Airflow Sensor and its Fabrication Method" by Lee et al.

FIELD OF THE INVENTION

The present invention relates to fluid flow sensors, and more particularly to so-called "hot wire" or thin-film type anemometer flow sensors which measure fluid flow parameters such as mass air flow by sensing the amount of heat the fluid flow removes from a heated element.

BACKGROUND AND SUMMARY OF THE INVENTION

As is well known, air flow parameter measurements are extremely useful in controlling the operation of an internal combustion engine. Typical conventional air flow sensors found in many of today's automotive systems operate on the hot wire anemometer principle. Briefly, a hot film or wire is heated by an electrical current so as to maintain a constant temperature differential between the heated element and another non-heated element (i.e., at ambient temperature). The air flowing past the heated element removes heat from the heated element (e.g., with increased air flow removing more heat)—requiring additional electrical heating current to maintain the heated element at the same constant temperature differential above ambient temperature. The electrical current supplied to the heated element may be measured (e.g., by measuring the voltage drop induced across a resistor coupled in series with the heating element or by using the voltage drop in the series resistors to control the current to the elements so as to force the resistance to stay constant) to provide a measure of air flow parameters (e.g., mass air flow).

The following is a by no means exhaustive listing of prior-issued patents relating to this type of air flow sensor:

U.S. Pat. No. 3,623,364 Withrow 30 Nov 1971
U.S. Pat. No. 4,244,217 Ledbetter 13 Jan 1981
U.S. Pat. No. 4,501,144 Higashi et al
U.S. Pat. No. 4,135,396 Stanke et al 23 Jan 1979
U.S. Pat. No. 4,478,076 Bohrer 23 Oct 1984
U.S. Pat. No. 4,283,944 Gruner et al 18 Aug 1981
U.S. Pat. No. 4,624,138 Ono et al 25 Nov 1986
U.S. Pat. No. 4,471,647 Jerman et al 18 Sep 1984
U.S. Pat. No. 4,637,253 Sekimura et al 20 Jan 1987
U.S. Pat. No. 3,992,940 Platzer, Jr. 23 Nov 1976
U.S. Pat. No. 4,733,559 Aine et al 29 Mar 1988
U.S. Pat. No. 4,672,847 Uchiyama et al 16 Jun 1987
U.S. Pat. No. 4,548,077 van Putten 22 Oct 1985
U.S. Pat. No. 4,566,320 Bohrer 28 Jan 1986
U.S. Pat. No. 4,587,842 Handtmann 13 May 1986
U.S. Pat. No. 4,596,140 Dorman et al 24 June 1986
U.S. Pat. No. 4,680,963 Tabata et al 21 Jul 1987

A typical prior art hot-wire anemometer sensing system includes of the following components:

(a) a heated element typically having a positive temperature coefficient of resistance (TCR);

(b) a cold (ambient temperature) element generally made of the same material as the heated element;

(c) a means for comparing the electrical characteristics (e.g., by measuring current flowing through the element) of the heated element with those of the cold element; and (d) a current supply for supplying current to the heated element so as to maintain a constant temperature difference between the heated element and the cold element.

In this arrangement, the current needed to maintain the constant temperature difference between the two elements is a measure of the fluid flow. As flow increases, more current is needed to heat the hot element since the hot element must supply additional heat to compensate for the heat removed from it by forced convection due to the fluid flow. At the same time, the cold element temperature tracks the temperature of the flowing fluid and thus automatically compensates for changes in the temperature of the fluid.

In the past, fluid flow sensors of the type described above were typically made using thin resistive wires or thick resistive films (or other materials) disposed on a substrate. More recently, however, thin-film technology has been successfully employed to provide such "hot-wire" air flow sensors. The thin-film sensor may be implemented on a silicon substrate using silicon micromachining and thin-film processing techniques. The resulting thin-film sensor is extremely small in size, consumes very little power, is relatively inexpensive to manufacture, and provides excellent sensor characteristics such as rapid response time.

One exemplary simple method for realizing a silicon-based thin-film sensor for sensing fluid flow parameters is to provide a single thin-film heating element formed on a thermally isolated diaphragm window. As described above, the element is self-heated to a certain temperature by supplying a biasing current through it. When the heated element is exposed to fluid flow, it tends to cool down, and its temperature decreases. A feedback circuit connected to the heated element senses and responds to this change (so as to sustain a constant temperature differential between the heated element and an additional element measuring the ambient temperature of the fluid flow). The feedback circuit thus responds by supplying more current to the heated element—with the fluid flow rate being related to this supplemented current.

However, this arrangement has some significant drawbacks. Due to the small size of the sensor, the signal-to-noise ratio (particularly at low flow rates) may be poor, and the sensor is often unduly sensitive to local disturbances. If the chip size is increased to improve this aspect of performance, the cost advantage tends to be degraded. Characteristics of the thin-film materials being used also place limitations on the amount of current that may be flowed through the thin-film elements (and thus upon the operating temperature ranges of the sensor). For example, the properties of some materials deposited in thin-film form change if the sensor is operated at high temperature or current levels. Further, the simple silicon-based sensor has not in the past fully utilized advanced silicon integrated circuit technology that might be used to add on-chip functions such as temperature compensation, linearization, signal conditioning, etc.

Different configurations of silicon-based thin-film mass air flow sensors are described in the above-referenced Lee et al U.S. Pat. No. 4,884,443 (and in the other patent applications referenced above). One version uses two additional sensing resistors to measure the temperature difference between the upstream and downstream fluid flows (providing a heating resistor between the upstream and downstream sensing resistors to heat the sensing resistors). Another version uses a heating resistor and a separate sensing resistor. Briefly, the sensing resistor detects the temperature of the heating resistor, and a control circuit supplies an appropriate current to the heating resistor in response to the resistance change of the sensing resistor so as to keep the temperature of the heating resistor constant.

Although these various thin-film sensors have been successful in their own right, further improvements are possible.

For example, one of the problems with prior "hot-wire" anemometer sensors in the past has been the need to supply a relatively large amount of current to heat the heated element. A "no flow" condition thus typically provides a relatively large signal offset that must be compensated for. This large signal offset limits the dynamic response range of the sensor response to flow (i.e., for a given supply voltage a large part is used to heat the element, leaving a limited voltage above that for the flow signal), and the sensor therefore does not "span" a sufficiently wide range of different fluid flows found in many applications and environment. In addition, high current densities necessary to heat the heated element may actually damage or otherwise alter the characteristics of the element at high flows—this problem becoming particularly acute in thin-film technology (since, for example, as mentioned previously, some materials when deposited in thin film form change their properties if operated at high current levels).

The present invention solves these problems and drawbacks by providing a new and extremely useful fluid flow sensor arrangement having plural heating elements thermally coupled to one another. This arrangement can provide a desirable solution to cope with the limitations caused by single-element thin-film sensors used in the past.

Briefly, one aspect of the present invention is to provide two discrete heating elements closely thermally coupled to one another (e.g., by stacking one element on top of the other). In the preferred embodiment, a constant current is supplied to one of the heating elements (this element may be termed a "transfer heater element"). Preferably, the transfer heating element supplies a substantial portion of the heat needed to maintain the other heating element at a constant temperature above ambient temperature under a particular fluid flow condition (e.g., no flow). The heat generated by the transfer heating element maintains the other heating element (herein termed the "sensor heating element") at some temperature above ambient (and in one particular configuration, substantially at the desired temperature differential above ambient temperature for no fluid flow) due to the close thermal coupling between the transfer heating element and the sensor heating element.

As fluid flow increases, heat is removed from the sensor heating element (and typically also from the transfer heating element) due to forced convection—thereby decreasing the temperature of the sensor heating element below the desired elevated temperature above ambient. The additional heat needed to maintain the sensor heating element above ambient temperature is provided by the sensor heating element itself through self-heating. That is, electrical current is supplied directly to the sensor heating element to cause it to itself generate sufficient additional heat necessary to maintain its own temperature above ambient temperature. The magnitude of this electrical current supplied to the sensor heating element may be measured (indirectly) as an indication of fluid flow parameters (i.e., mass air flow).

Thus, the transfer heating element essentially determines the initial operating temperature of the heating element (this initial operating temperature may be set by a constant current supplied to the transfer heating element). The sensor heating element electrically isolated from but nearly perfectly thermally coupled with the transfer heating element responds to temperature changes caused by air flow changes by decreasing its resistance (due to its positive temperature coefficient). In response to this decreased resistance, the feedback circuit arrangement coupled to the sensor heating element pumps more current into the sensor heating element so as to maintain the sensor heating element at a constant temperature differential above ambient temperature. The additional current pumped into the sensor heating element may be measured as representative of the fluid flow characteristics.

The functional separation of initialization and flow sensing significantly improves low-flow sensitivity, enhances the long term stability of the sensing element, and permits a higher operating temperature. Increased sensor temperature operating range is provided at least in part because most or all of the current flowing through the sensor heating element is attributable to heat removed from the sensor heating element due to increased fluid flow—thus reducing the current density within the sensor heating element (and at the same time reducing the offset in the signal derived from the sensor heating element current flow). There is no penalty in chip size if the transfer and sensor heating elements are vertically stacked, and a higher degree of integration (e.g., building an on-chip full resistor bridge) is possible or facilitated if the transfer and sensor heating elements are made from different materials. Sensor response time can also be improved significantly without substantially increasing power consumption.

The present invention also provides a silicon-based air flow sensor of the type described above fabricated in a new overall process involving micromachining and standard integrated circuit fabrication processes. Preferably, a thin silicon diaphragm window is provided upon which is formed the transfer heating element (e.g., using thin-film technology). The sensor heating element may be formed on top of (or very close to) the transfer heating element and should be electrically insulated from the transfer heating element (e.g., by a dielectric material such as silicon dioxide or silicon nitride disposed between the two elements). The transfer and sensor heating elements may eventually be coated with a passivation layer (e.g., PECVD nitride or oxynitride). The fabrication process may include forming a deep diffusion doped layer around the diaphragm window, multiple dielectric layers for the diaphragm windows, a resistive thin-film layer for the transfer heating element, a dielectric layer on top of the transfer heating element for electrical insulation (if the transfer and sensor heating elements are stacked), etched holes in the insulation layer to provide electrical conductor access, a second resistive thin-film layer for the sensor heating element, an additional passivation layer, etched holes through the passivation for interconnects, and a diaphragm window (e.g., using a silicon anisotropic etching process).

The diaphragm window in this arrangement provides a good thermal insulation for the heating and insulating elements and low thermal mass to allow fast response to temperature change. This dielectric diaphragm also provides good electrical insulation.

The present invention exhibits many advantages compared to prior air flow sensor designs, including the following:

significantly higher sensitivity to low-velocity flow;
more flexibility to configure compensation arrangements (e.g., due to the additional heater element which is outside of the control loop);
less current demand for the sensing element, thus allowing higher operating temperatures and longer lifetime;
more effective use of a given diaphragm area;
improved response rate without proportionally higher power consumption (heat conductance can be significantly increased with a less significant increase in heat capacity); and
better potential to add further resistive elements on the same sensor chip without sacrificing chip area (e.g., by vertical stacking of elements and/or the use of different resistive materials for different elements).

BRIEF DESCRIPTION OF THE DRAWINGS

These and other features and advantages of the present invention will be better and more completely understood by referring to the following detailed description of presently preferred exemplary embodiments in conjunction with the FIGURES, of which.

DETAILED DESCRIPTION OF PRESENTLY PREFERRED EXEMPLARY EMBODIMENTS

Figure 1:
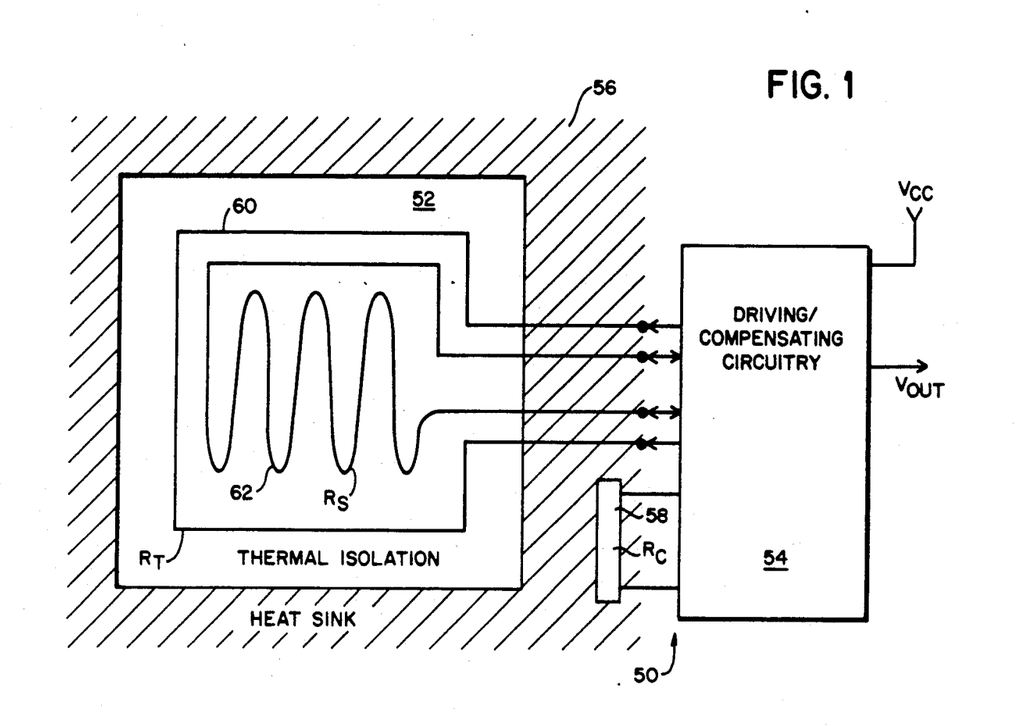
FIG. 1 is a schematic planar representation of a presently preferred exemplary embodiment of a hot-wire anemometer sensor system including a sensor structure having a transfer heating element thermally coupled to a sensor heating element.

FIG. 1 is a schematic block diagram of a fluid flow sensing system 50 in accordance with a presently preferred exemplary embodiment of the present invention. The system 50 may be used, by way of non-limiting example, to measure mass air flow within an air supply passage of an internal combustion engine.

System 50 in the preferred embodiment includes a solid-state integrated circuit (IC) silicon-based sensing structure 52 electrically coupled to driving/compensating circuitry 54 (in some applications it may be desirable to incorporate circuitry on a common IC with the sensor structure). Circuitry 54 is supplied with a power supply voltage $V_{cc}$, which it converts into electrical currents for driving sensor structure 52. Driving/compensating circuitry 54 also measures the amount of current delivered to sensor structure 52 and derives from that measurement an output signal $V_{out}$ indicating the parameters of the fluid flow to which sensor structure 52 is exposed (in the preferred embodiment, the output signal $V_{out}$ indicates the mass air flow which sensor structure 52 is exposed to).

Driving/compensating circuitry 54 in the preferred embodiment preferably includes, as a portion of its driving circuitry, a comparison circuit for comparing the resistance $R_S$ of a hot element 62 to the resistance $R_C$ of a cold element 58. The current in both elements is increased as demanded by increased flow which tends to cool the hot element. The cold element 58 is cool in the preferred embodiment because it dissipates less power and/or it has a lower thermal impedance to the heat sink. As mentioned, in the preferred embodiment the cold element 58 is preferably located on the same integrated circuit 56 as is sensor structure 52 but is thermally isolated from sensor structure 52 so as to be maintained at the ambient temperature of the fluid flow. This cold element 58 is used to provide a reference temperature signal so that driving/compensating circuitry 54 may maintain sensor structure 52 at a predetermined temperature above the ambient temperature of the fluid flow (and so that system 50 automatically adjusts to the temperature of the flowing fluid).

In the preferred embodiment, a heated transfer element 60 is provided. This transfer element 60 is thermally coupled to the hot element 62. The hot element 62 is at a uniform temperature since it dissipates power uniformly along its path and it is a constant distance from the heat sink. The heat flow is from the hot elements 60, 62 to the heat sink except for what is lost into the air. When there is no air flow, everything inside element 60 is at nearly the same temperature, but there is a temperature gradient from element 60 to the edge of the heat sink which is at ambient temperature (this gradient area exists as part of 52 as depicted in FIG. 1).

Sensor structure 52 in the preferred embodiment thus includes a transfer heating element 60 with a resistance of $R_T$; and a sensor heating element 62 with a resistance of $R_S$. Elements 60 and 62 are closely thermally coupled to one another so that they are at substantially the same temperature. Additional current flowing through the sensor heating element 62 adds heat through self-heating of the sensor heating element—thereby increasing the temperature of the sensor heating element.

Driving/compensating circuitry 54 in the preferred embodiment provides such additional current in a controlled amount to the sensor heating element so that the temperature of the sensor heating element is elevated by two heat sources: the self-heating provided by the current flowing through sensor heating element 62; and the heating of the sensor heating element due to the transfer of heat from transfer heating element 60.

In the preferred embodiment the current flowing through the transfer heating element 60 is independently controlled, and in the preferred embodiment is preferably held constant. Therefore, when sensor structure 52 is exposed to fluid flow, driving/compensating circuitry 54 causes additional current to flow through the sensor heating element 62 to maintain the temperature of the sensor element at a predetermined temperature differential above the temperature of the cold (reference) heating element 58. A constant current increases the power as ambient temperature increases, which is what is needed for temperature compensation of the circuit. However, under other operating conditions and in other applications, a constant current might not be optimum.

Figure 1A:
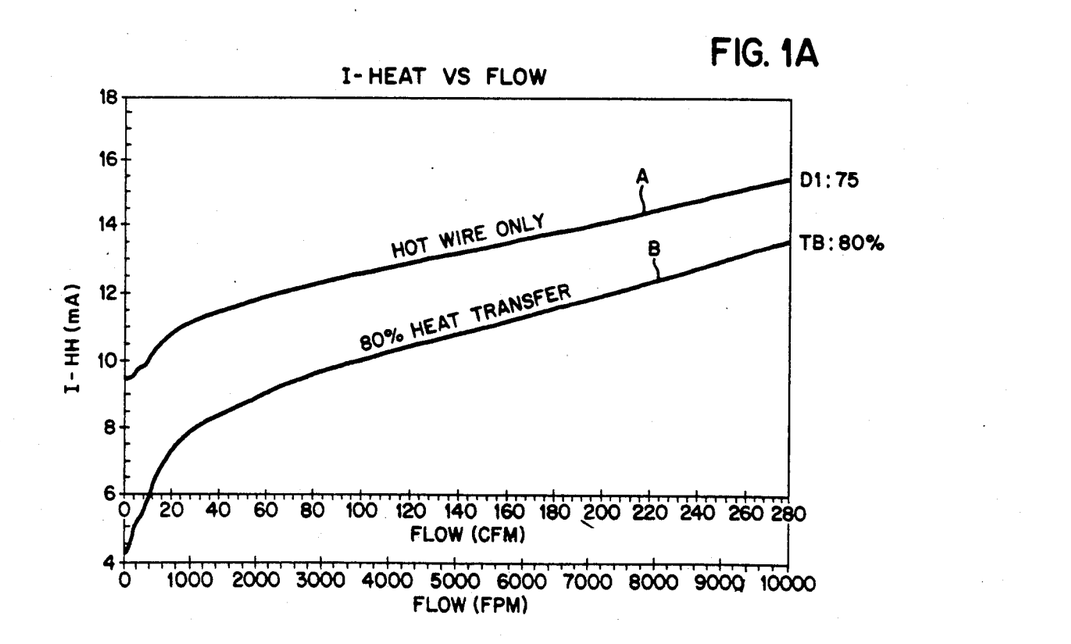
FIG. 1A is a graphical illustration of actual measurements of an exemplary transfer function associated with the FIG. 1 system as compared with the transfer heater disconnected.
Figure 4:
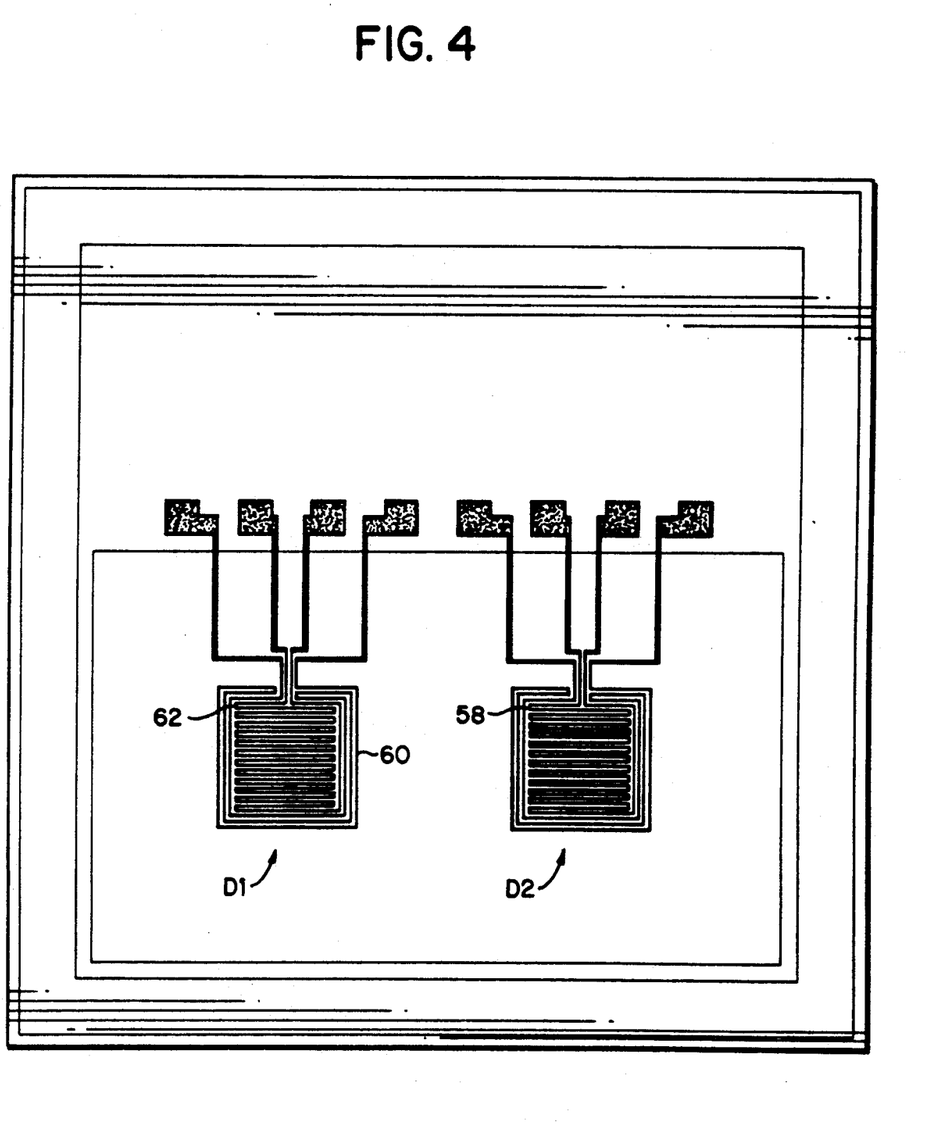
FIG. 4 is a schematic plan diagram of an exemplary first silicon-based embodiment of the FIG. 1 sensor providing interlaced or juxtaposed transfer and sensor heating elements.

FIG. 1A is a plot of graphical information representing actual experimental data measured from an actual sensor system 50 of the type shown in FIG. 1 (the layout of the device used to provide the experimental data is shown in FIG. 4). The curve "A" represents the change in current through sensor heating element 62 when transfer heating element 60 is disconnected and all of the heat used to maintain the sensor heating element 62 at the desired temperature above ambient is produced through self-heating. The curve labelled "B", on the other hand, represents the situation shown in FIG. 1 in which (in one embodiment) about 80% (at no flow conditions) of the heat used to heat sensor heating element 62 is obtained from transfer heating element 60, with remaining 20% being obtained through self-heating of the sensor heating element. As can be seen in the FIG. 1A graphs, both curves maintain a 75° C. difference above ambient levels. However, in the case of curve "A" (when the sensor heating element 62 supplies all of the heat through self-heating), the current and therefore the current density is much higher than in the case of curve "B" (in which nominally 80% of the heat is provided by transfer heating element 60). Moreover, the percent change in current flowing through sensor heating element 62 in response to changes in fluid flow is greater when 80% of the heat is provided by the transfer heating element 60.

Figure 2:
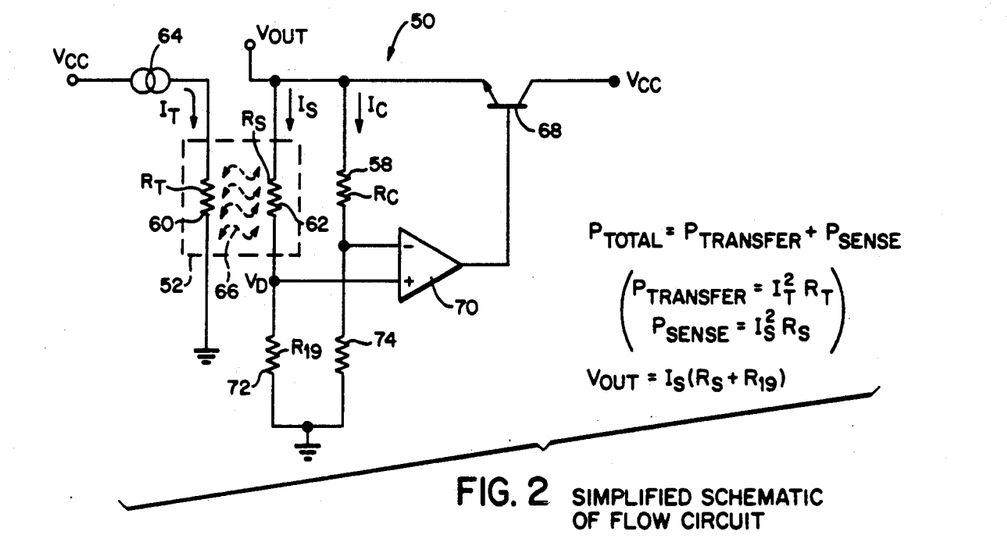
FIG. 2 is a simplified schematic diagram of a preferred embodiment sensing system including the FIG. 1 sensor.

FIG. 2 is a simplified electrical schematic diagram of system 50 shown in FIG. 1. The constant current source 64 provides a constant current through transfer heating element 60 in the preferred embodiment. Transfer heating element 60 has a resistance of $R_T$—thus converting the current $I_T$ into heat energy 66. This heat energy 66 is transferred from transfer heating element 60 to sensor heating element 62, thus elevating the temperature of the sensor heating element. An additional current $I_S$ flows through heating element 62—resulting in self-heating of the sensor heating element.

In the FIG. 2 embodiment a resistor 72 ($R_{19}$) is connected in series with sensor heating element 62 to provide a voltage divider—with the voltage drop $V_D$ across resistor 72 being proportional to the current $I_S$ flowing through sensor heating element 62. Comparator 70 compares this voltage drop $V_D$ with a further voltage drop generated across a further resistor 74 connected in series with cold element 58 (with the relative values of resistors 72, 74 being adjusted to provide a desired temperature differential $\Delta T$ between the temperature of cold element 58 and the temperature of sensor heating element 62).

Elements 60, 62 and 58 all have positive temperature coefficients of resistance (TCR) in the preferred embodiment, and thus an increase in temperature results in an increase in resistance and vice versa. As fluid flow increases, the amount of heat removed from sensor heating element 62 increases correspondingly—resulting in a decrease in the temperature of the element and a corresponding decrease in element resistance. A resulting increase in current $I_S$ occurs due to the decreased element resistance with a corresponding increase in the voltage $V_D$ across resistor 72 resulting. Op amp 70 responds to this increase in the voltage drop across resistor 72 relative to the voltage drop across resistor 74 by outputting a control signal which increases the conductance of transistor 68 and thus applies a controlled amount of increase in current $I_S$ to the sensor heating element 62 (so as to increase the power dissipated by the element in heat). This increased heat generated by sensor heating element 62 is effectively summed with the heat provided by transfer heating element 60 so as to increase the temperature of sensor heating element 62 to the desired differential temperature above the temperature of cold element 58. The resistance of cold element 58 and of resistor 74 may be selected so as to minimize any self-heating effects associated with the cold element 58 (or additional precautions may be taken as will be described below in conjunction with FIG. 3).

In FIG. 2 it is easy to see that $V_{out}$ will increase until the bridge balances due to $R_S$ heating up until $$\frac{R_{19}}{R_S + R_{19}} = \frac{R_C + R_{74}}{R_{74}}$$

In order for this to work, $R_C$ cannot heat up as much as $R_S$. This is a problem in most hot wire anemometer structures. In the preferred embodiment (as is shown in FIG. 3), this is handled by reducing the current in $R_C$ by the ratio of $$R_{21}/R_{19}$$

using op amp 82 and transistor 84 as a voltage follower. However, since $R_C \approx R_S$, the voltage drop across $R_C$ is less than $R_S$. Therefore, $R_7$ and $R_8$ are used to divide the voltage across the $R_S + R_{20}$ combination. Now the "bridge" will stay balanced if enough current is in $R_S$ to heat it up to the right value without danger of heating $R_C$ which has a proportional but lower current. $R_8$ and $R_{20}$ both control $\Delta T$ in opposite directions. If $R_C$ has a higher resistance value or a lower thermal resistance to the heat sink or is not heated by the transfer heater, it will not be as hot and the circuit in FIG. 3 would not be necessary. $R_S$ and $R_C$ are preferably matched so they track over temperature which is how the device in FIG. 4 was designed. $R_C$ is also on a separate diaphragm.

Figure 3:
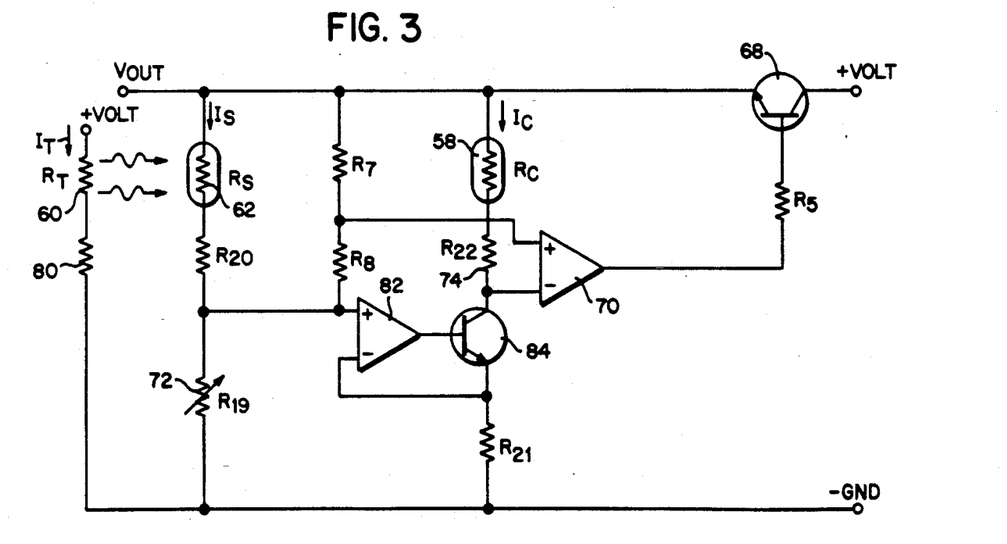
FIG. 3 is a more detailed schematic diagram of the FIG. 2 system.

FIG. 3 is a detailed schematic diagram of an exemplary sensor system 50 incorporating the additional features described above. In a preferred embodiment, the constant current source 64 depicted in FIG. 2 is implemented by connecting transfer heating element 60 across the power supply voltage (with a current limiting resistor 80 being provided to set the amount of current flowing through the transfer heating element). An additional operational amplifier 82 and associated transistor 84 are provided in the FIG. 3 circuit to cause less current to flow through cold element 58 (thereby reducing the self-heating effects within cold element 58).

A constant current $I_T$ is forced through transfer heating element 60 to set a certain sensor temperature. Since the sensor heating element 62 is nearly perfectly coupled to the transfer heating element 60, the sensor operating temperature can be monitored by measuring the change in the sensor heating element resistance $R_S$. Once the sensor operating temperature is set, the voltage level provided across the sensor heating element 62, resistor R20 and resistor 72 (R19) under no air or fluid flow conditions is adjusted using the resistor bridge and the feedback circuit. For example, the resistance bridge parameters (e.g., R19) may be adjusted to provide a $V_{out}$ signal level of 0.5 V (preferably the no air or fluid flow $V_{out}$ signal level is adjusted so that current passing through the sensor heating element 62 under no flow conditions is relatively low so as to not cause any significant self-heating). The heat energy generated by sensor heating element 62 through self-heating may be less than 1% of the heat generated by transfer heating element 60 under no flow conditions.

Figure 8:
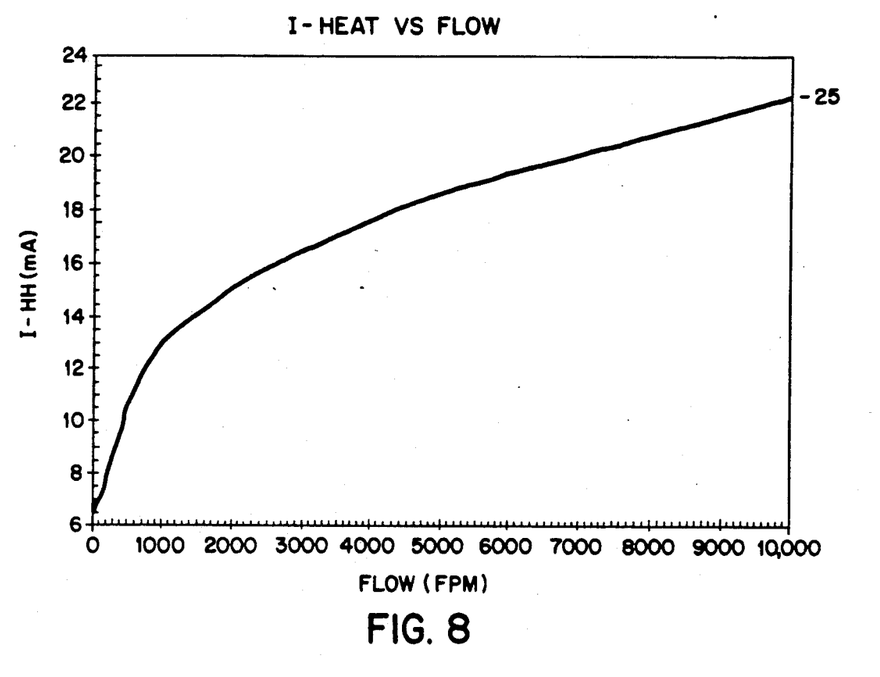
FIGS. 8 and 9 are graphical illustrations of actual measurements of characteristics of the FIG. 7 sensing structure.
Figure 9:
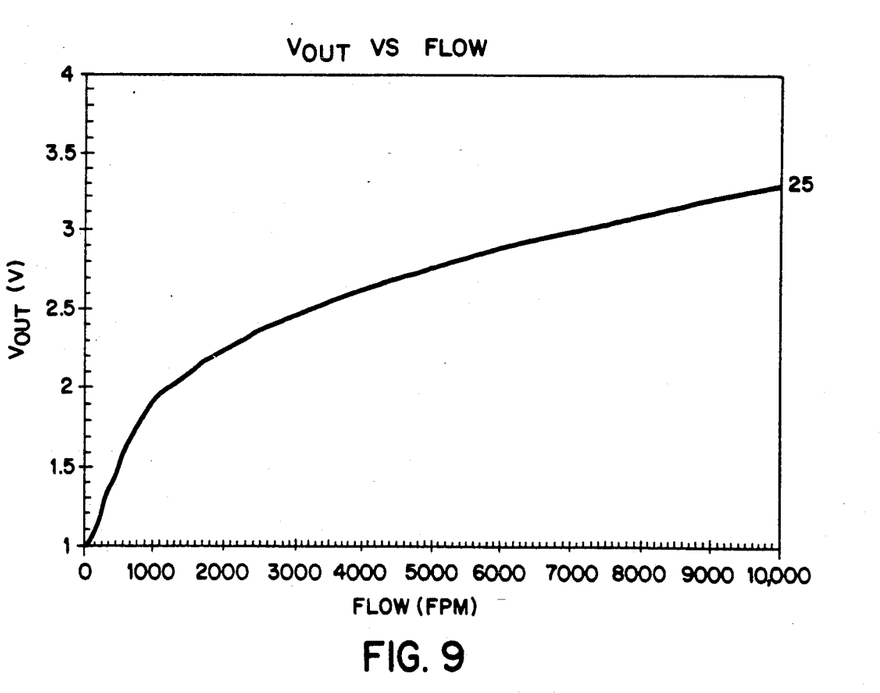

Under air or fluid fluid flow conditions, the sensor heating element 62 cools down and the feedback circuit (e.g., op amp 70) attempts to restore the initial temperature above the ambient temperature measured by cold element 58. Since the power supplied to the transfer heating element 60 is fixed, all of the required power needed to increase the temperature is supplied by the feedback circuit through transistor 68. In this way, the sensor heating element 62 solely responds to forced air convection caused by fluid flow while the transfer heating element 60 current bias is set independently to establish an operating temperature for the sensor heating element. See FIGS. 8 and 9 for exemplary graphical illustrations of sensor heating element 62 current and voltage $V_{out}$, respectively, versus air or fluid flow.

Thus, in accordance with one feature provided by the present invention, the functions of maintaining initial sensor temperature under no flow conditions and increasing heat output to compensate for fluid flow are independently provided. The transfer heating element 60 provides substantially all of the heat output needed to maintain the sensor structure 52 at a predetermined temperature above ambient temperature under no flow conditions, and sensor heating element 62 provides almost none of this heat output. Sensor heating element 62 in the preferred embodiment provides all of the heat necessary to compensate for forced convection heat removal from sensor structure 52 due to fluid flow—and thus, almost all of the current flowing through sensor heating element 62 is responsive to fluid flow parameters. This arrangement thus provides a very low offset voltage/current in output signal $V_{out}$, and thus also increases the percent amount of change in current-/voltage responsive to fluid flow.

Figure 5:
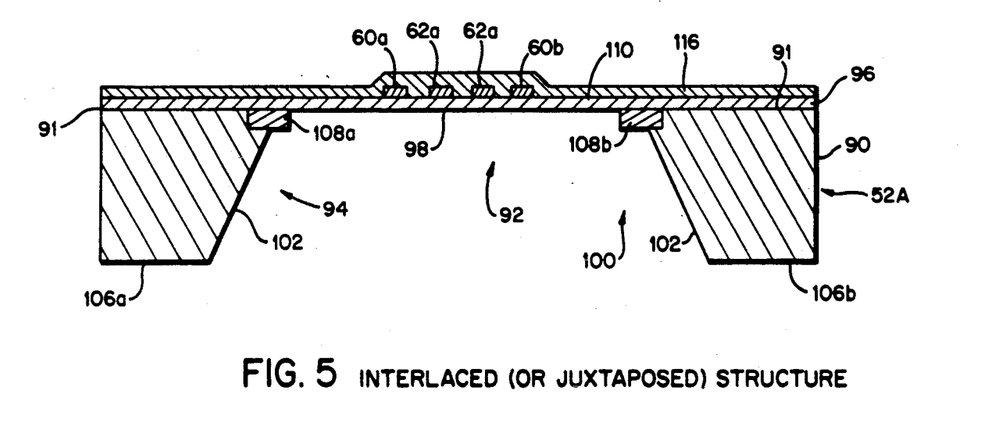
FIG. 5 is a side view in cross-section of the first silicon-based embodiment of the FIG. 4 sensor.
Figure 7:
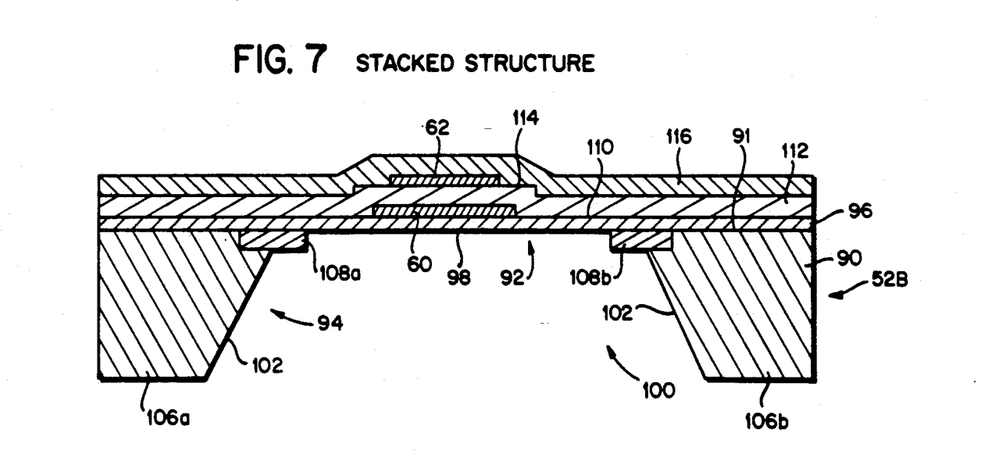
FIG. 7 is a side view in cross-section of the structure shown in FIG. 6.

FIGS. 5 and 7 illustrate the basic silicon-based sensor structure 52 shown in FIG. 1, and depict two alternate embodiments (52A, 52A, respectively) of the FIG. 1 sensor structure 52. FIG. 5 shows a first embodiment 52A in which transfer and sensor heating elements 60a, 62a are coplanar and interlaced or juxtaposed, while FIG. 7 shows a second embodiment 52B in which the transfer and sensor heating elements are vertically stacked one overlying the other.

The sensor structures 52A, 52B shown in FIGS. 5 and 7 each include a silicon substrate 90 having a (100) orientation. A dielectric layer 96 (which in the preferred embodiment actually comprises two SiO$_2$ layers sandwiching a layer of Si$_3$N$_4$) uniformly covers a front or top surface 91 of silicon substrate 90. A "window" or diaphragm 92 is formed from this dielectric layer 96 (in the preferred embodiment the substrate 90 is recessed at 94 so that only the dielectric layer remains in this diaphragm region). While FIGS. 5 and 7 are cross-sectional representations, it will be understood that in the preferred embodiment silicon substrate 90 may form a lip substantially completely surrounding diaphragm 92 and may in some embodiments be much larger than needed merely to surround the diaphragm (e.g., so as to permit integration of other components on the same substrate).

In the preferred embodiment, dielectric layer 96 is relatively thin (e.g., as thin as one micron) and thus has a very low mass. A center region 98 of dielectric layer 96 is thermally well isolated from the silicon substrate 90, the silicon substrate itself acting as an excellent heat sink. Although the mechanical ruggedness of diaphragm 92 depends upon its size (area), a moderate size (e.g., 1 mm × 1 mm) can stand a significant pressure (e.g., 60 psi).

In the preferred embodiment, a square (or rectangular) window 100 is defined on the "open" side of silicon substrate 90 by edges 102 in line with the (110) crystallographic direction. The backside substrate surfaces 106a,b are also covered with a dielectric layer not shown (this layer is made of silicon dioxide in the preferred embodiment).

In the preferred embodiment, a rectangular heavily boron doped (P+) silicon layer 108a,b bounds diaphragm 92. The role of doped layer 108a,b is to accurately define the size and shape of diaphragm 92 such that each diaphragm provides an identical thermal isolation to the thin-film sensing or heating elements This layer 108a,b (which is actually a single, doughnut-shaped region in the preferred embodiment) also facilitates formation of any desired shape of diaphragm 92 (although typical silicon anisotropic etching usually results in higher success rates if the diaphragm is formed as a rectangle or a square).

Transfer heating element 60 is disposed on an upper surface 110 of diaphragm 92 (that is, on an upper surface of dielectric layer 96). This transfer heating element 60 may be shaped to have a simple meander or a derivative thereof, for example. The line width of transfer heating element 60 may be varied along the length of the element to compensate for different degrees of thermal isolation if the element covers a large portion of the diaphragm 92 surface area. If the transfer heating element 60 is highly resistive, a finger-like layout may be used to reduce the total resistance.

A variety of suitable resistive materials may be used to fabricate transfer heating element 60. For example, refractory metals such as W, Mo, Ta, etc. are good candidates. Pt and Au may be used if a proper adhesion and diffusion barrier material is provided (e.g., as part of or on top surface 110 of dielectric layer 96) and providing proper patterning techniques are available. TiW is found to be very effective for this purpose. Another excellent candidate is polysilicon, since this material has a large resistivity range and a large temperature coefficient of resistivity (TCR) and withstands high temperature processing.

In the FIG. 5 embodiment, the sensor heating element 62a is placed close to or interlaced with transfer heating element 60 so as to achieve extremely good thermal coupling between the two elements The sensor heating element 62 may have the same shape but a different line width as those of the transfer heating element 60. Preferably, each of elements 60a, 62a in the FIG. 5 embodiment are planar and the elements are so arranged (e.g., by including interdigitated finger portions) so that the elements need not cross over one another and so that each of the elements has all of its extents disposed on dielectric layer 96.

An exemplary configuration is shown in FIG. 4. This FIG. 4 configuration includes two separate diaphragms D1, D2 each having two elements. The two elements of the first diaphragm D1 may be connected as elements 60, 62 (with element 62 being the "inside" element surrounded by element 60). The inside element of the second diaphragm D2 is preferably connected as cold element 58 since it is matched to inside element 62 of diaphragm D1. In the preferred embodiment the "outside" element of diaphragm D2 is unused.

Sensor heating element 62 may be made from the same material used to make transfer heating element 60, or alternatively, a different suitable material may be used to make the transfer heating element. Since the sensor heating element 62 is used as a flow or temperature sensing element, however, it should have a high TCR (and thus platinum and gold may be suitable candidates for the material comprising sensor heating element 62).

FIG. 7 shows an alternative embodiment of sensor structure 52B in which the transfer heating element 60 and the sensor heating element 62 are vertically stacked one on top of the other. This vertical stacking achieves good thermal coupling and also may reduce sensor size by reducing the surface area occupied by the sensor structure. In the preferred embodiment, the transfer heating element 60 is disposed on the top surface 110 of dielectric layer 96 (see FIG. 6A). An additional electrically insulating (but preferably not significantly thermally isolating) layer 112 is disposed on the transfer heating element 60 (and in the preferred embodiment covers all of the transfer heating element except where electrical interconnects are required between elements 60, 62 along with portions of dielectric layer surface 110 not covered by the transfer heating element). The material from which transfer heating element 60 is made may largely determine the material from which insulating layer 112 is fabricated. For example, if transfer heating element 60 is made from gold, the insulating layer 112 must be formed at a sufficiently low temperature to avoid deterioration of the formed gold element.

Figure 6:
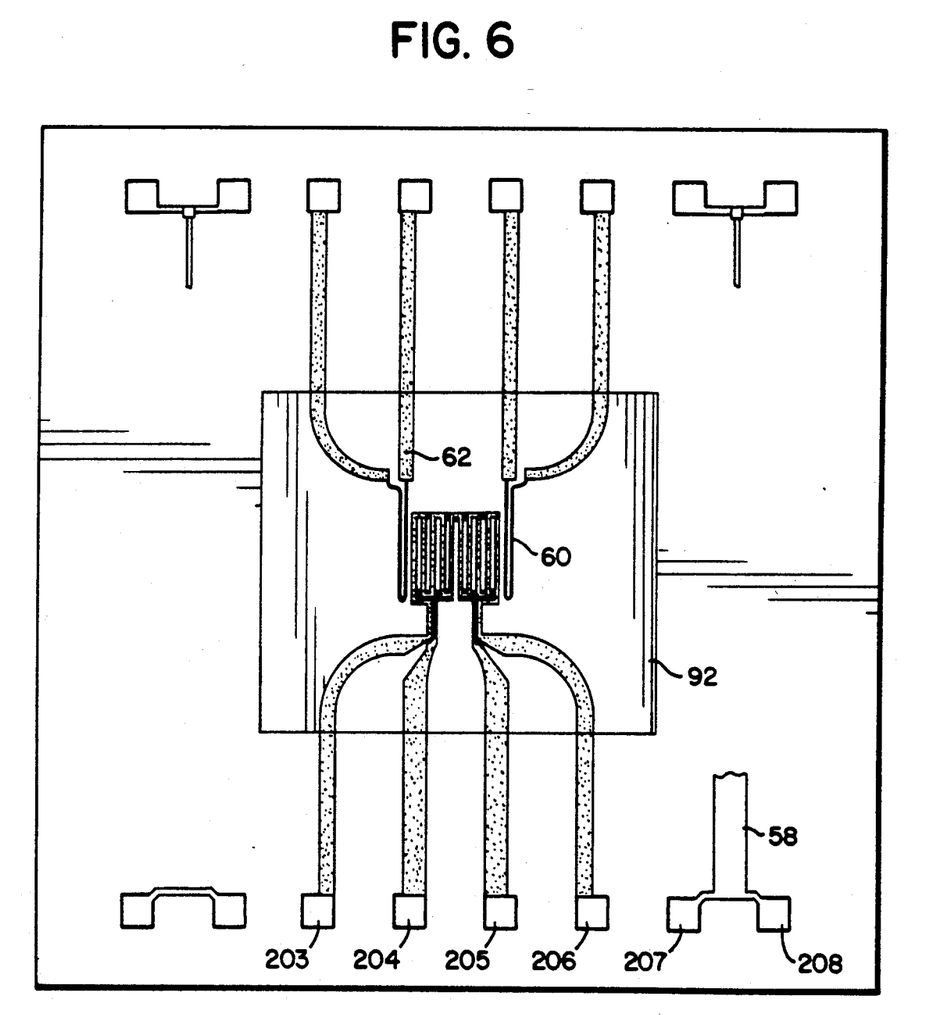
FIG. 6 is an overall assembled view of a further exemplary silicon based embodiment in which the transfer and heating elements are stacked vertically.
Figure 6A:
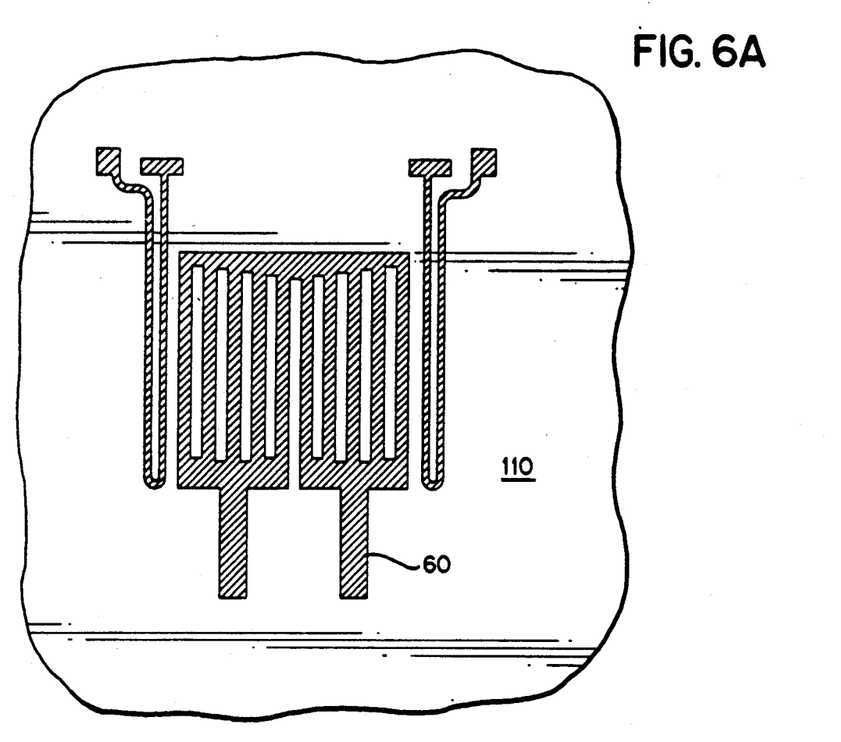
FIG. 6A is a view in plan of the bottom poly layer of the embodiment shown in FIG. 6.
Figure 6B:
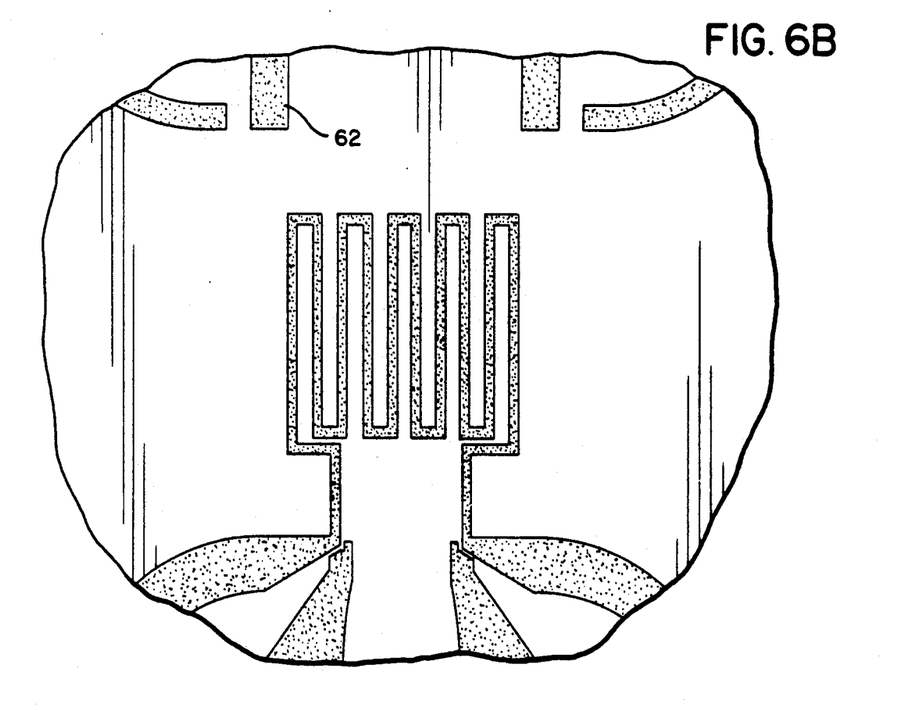
FIG. 6B is a view in plan of the top metal layer of the FIG. 6 embodiment.
Figure 6C:
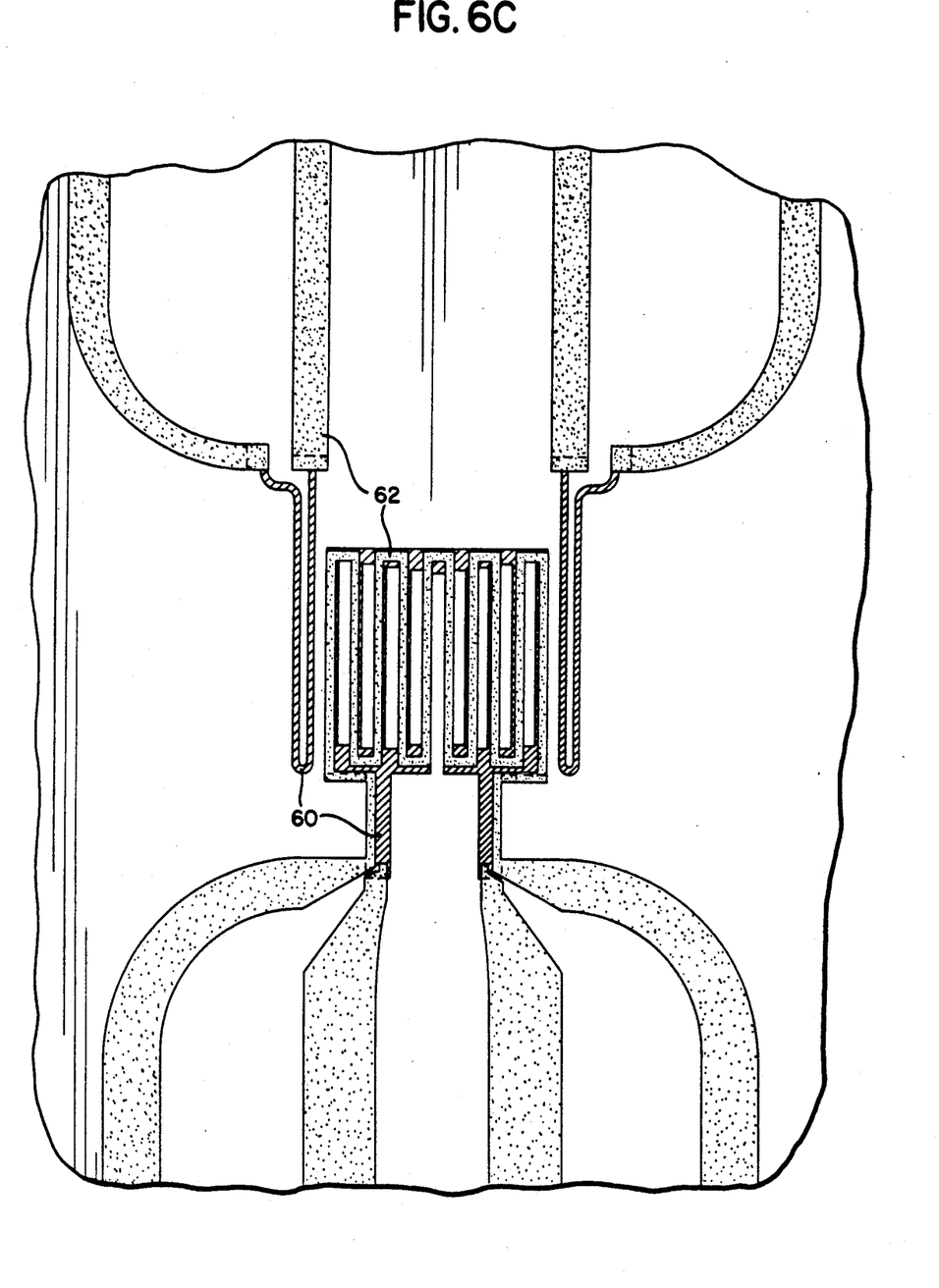
FIG. 6C is a detailed view showing the FIG. 6A and 6B layers assembled.

The sensor heating element 62 (an exemplary configuration for which is shown in FIG. 6B) covers an upper surface 114 of insulating layer 112 in the area proximate to transfer heating element 60. In the preferred embodiment, the patterns defined by sensor heating element 62 are positioned to substantially overlap with the patterns defined by transfer heating element 60 so as to provide maximum thermal coupling between the two elements (see FIG. 6C). It is desirable to make the linewidth of the sensor heating element 62 narrower than that of the transfer heating element 60 (as is shown in FIG. 6C) and to not allow the elements to cross over one another. The sensor heating element 60 material in the FIG. 7 embodiment should satisfy the same TCR requirement as in the FIG. 5 embodiment.

It is desirable to apply a passivation layer 116 over top of elements 60, 62 in each of the FIG. 5 and 7 embodiments to protect the heating elements 60, 62 from hostile environmental conditions and also from the silicon anisotropic etchants that may be used during the fabrication process (i.e., to etch region 100). The passivation layer 116 may comprise, for example, an oxynitride layer that covers resistive elements 60, 62.

FIGS. 5A-5E are chronological illustrations of preferred embodiment exemplary fabrication steps that may be used to fabricate the FIG. 5 interlaced embodiment, while FIGS. 7A-7G are chronological illustrations of preferred embodiment exemplary fabrication steps that may be used to fabricate the FIG. 7 vertically stacked embodiment.

Figure 5A:
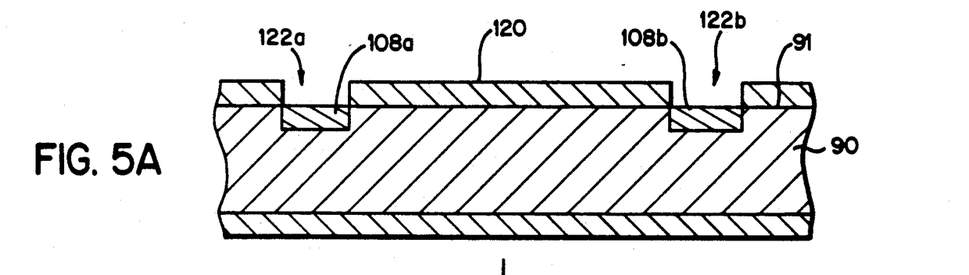
FIGS. 5A–5E schematically illustrate an exemplary preferred embodiment process for fabricating the silicon-based structure shown in FIG. 5.
Figure 7A:
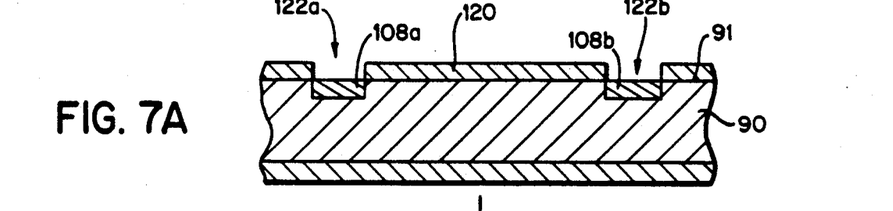
FIGS. 7A–7G illustrate an exemplary fabrication process used to fabricate the structure shown in FIG. 7.

In both of the FIG. 5 and FIG. 7 embodiments, fabrication begins by providing a (100)-oriented silicon wafer 90. A thick silicon dioxide layer 120 is formed on silicon substrate surface 91 (e.g., by a direct chemical reaction of oxygen and the silicon) and windows 122 are then removed from the silicon substrate to expose silicon. A high concentration of boron is then deeply diffused (in a conventional manner using conventional deep diffusion techniques such as a deposition using a BN source and a drive in at a temperature in excess of 1100° C.) into substrate 90 through windows 122 to form the P+ doped regions 108a, b discussed above in a pattern corresponding to the outline of the diaphragm 92 desired to be formed (as discussed above, actually only a single, doughnut-shaped rectangular region 108 is formed in the preferred embodiment). FIGS. 5A and 7A show the resulting structure at this stage of fabrication.

Figure 5B:
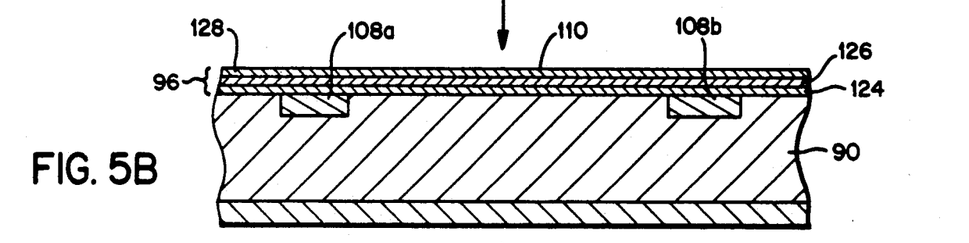
Figure 7B:
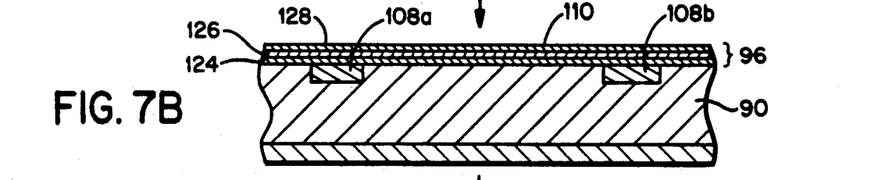

After the diffusion step, the silicon oxide layer 120 is stripped and a fresh thin thermal oxide layer 124 is regrown in its place. A nitride layer 126 is then deposited on silicon dioxide layer 124 (e.g., using low-pressure chemical vapor deposition —LPCVD), and another silicon dioxide layer 128 is deposited on the nitride layer. Layers 124, 126 and 128 together form the dielectric layer 96 shown in FIGS. 5 and 7. The structure existing at this stage of the fabrication process is shown in FIGS. 5B and 7B.

The fabrication processes diverge at this stage depending upon whether the FIG. 5 interlaced sensor structure 52A or the FIG. 7 stacked sensor structure 52B is being provided. Briefly, both embodiments of the process involve coating the dielectric layer 96 upper surface 110 with a resistive film to form at least transfer heating element 60; and depositing passivation layer 116 over the formed element.

Figure 5C:
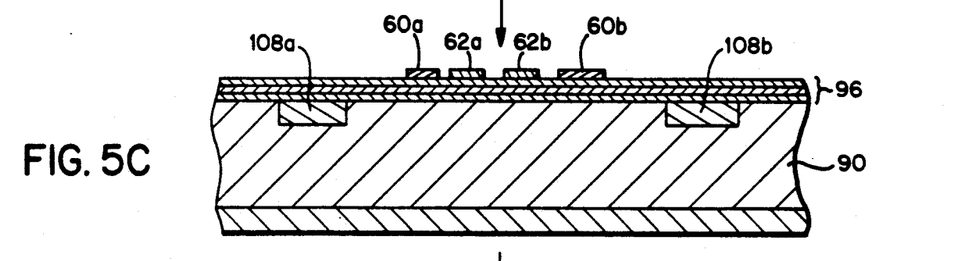
Figure 5D:
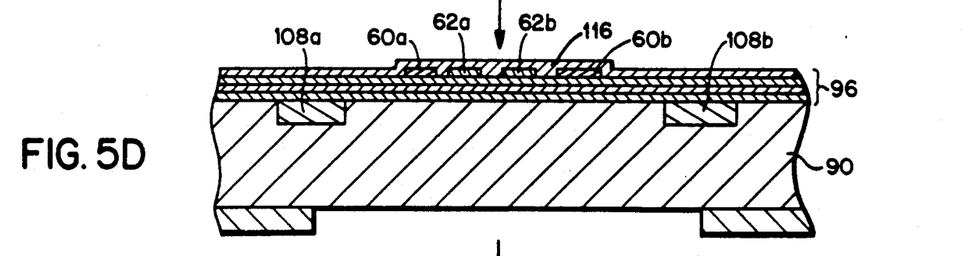
Figure 5E:
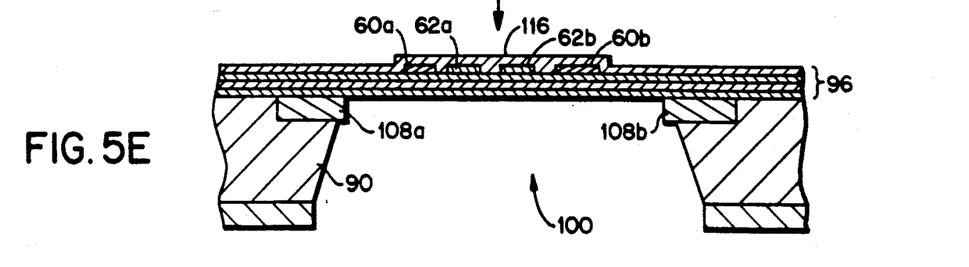

Referring to FIG. 5C and the associated process for fabricating the interlaced sensor structure 52a shown in FIG. 5, both the transfer heating element 60a,b and the sensor heating element 62a,b are fabricated in the same fabrication step if they are made from the same resistive film material (thus saving an additional fabrication step)—although FIG. 5C depicts the more general case in which elements 60a,b, 62a,b are made from different materials (and thus typically must be formed in two separate fabrication steps). Resistive films of appropriate materials as discussed above are formed in desired (e.g. interlaced, interdigitated, etc.) patterns using conventional (e.g., thin film deposition) techniques.

In the embodiment shown in FIG. 5C, the transfer heating element 60 includes two spatially separated element members 60a, 60b made of the same material and deposited at the same time (preferably element members 60a, 60b are part of the same continuous element and are connected together at another point not shown in the cross-sectional diagram depicted but as depicted in FIG. 4)—thus forming a continuous resistive element. In the embodiment shown, element 60 "surrounds" element 62, which element 62 may also include two spatially separated element members 62a, 62b made of the same material and deposited at the same time (and preferably comprising different portions of the same single element and thus being connected at another point not shown). Elements 60 and 62 are not electrically coupled together due to the physical separation between the elements. FIG. 4 depicts one exemplary satisfactory configuration for elements 60, 62 (which configuration is also shown schematically in FIG. 1) wherein transfer heating element 60 is patterned as a square box surrounding sensor heating element 62, which element 62 meanders within the area defined inside of the transfer heating element without electrically contacting the transfer heating element. FIG. 4 actually shows two diaphragms D1, D2 each of which has two elements. One of the elements on one of the diaphragms may be only used for $R_C$. The other element is unused in the preferred embodiment.

Figure 7C:
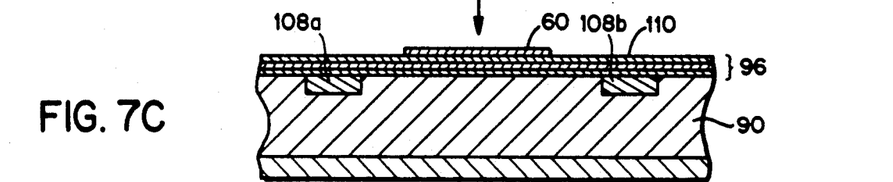
Figure 7D:
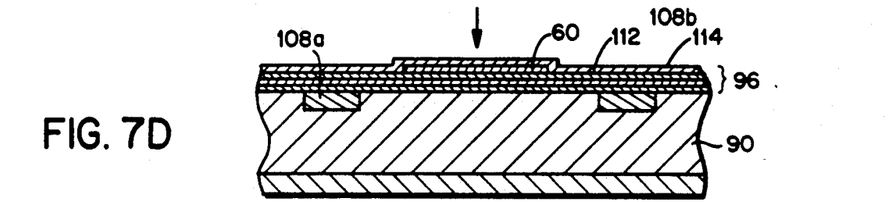
Figure 7E:
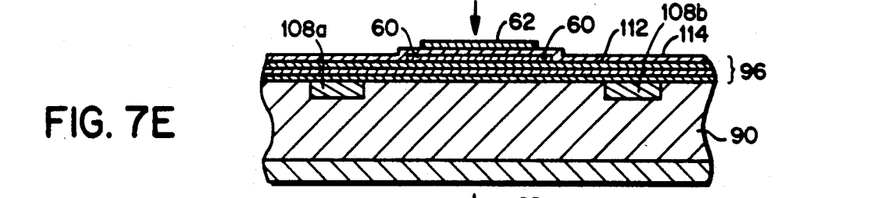
Figure 7F:
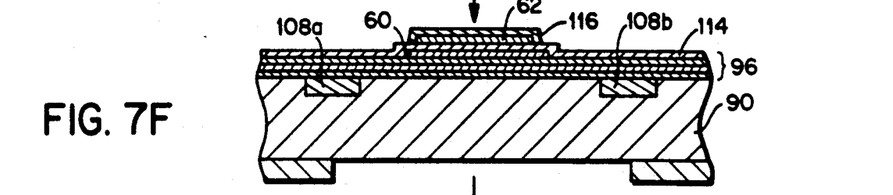
Figure 7G:
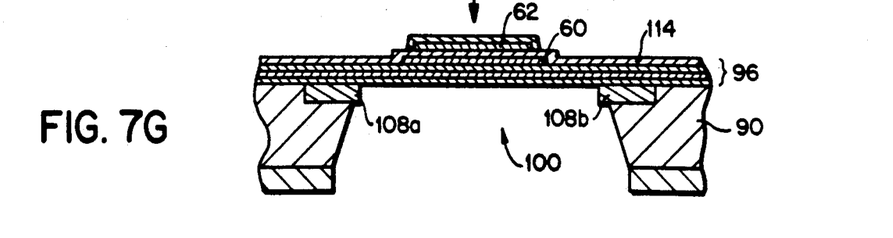

FIGS. 7C–7E depict intermediate structures formed after formation of dielectric layer 96 to provide the FIG. 7 stacked sensor structure 52. Transfer heating element 60 is preferably formed on dielectric layer 96 upper surface 110 using conventional thin film formation/deposition techniques (FIG. 7C). An additional dielectric layer 112 is then formed over dielectric layer upper surface 110 and the newly-formed transfer heating element 60 using a fabrication process that will not damage the formed thin film transfer heating element. Depending upon the type of material used to form the transfer heating element 60, dielectric layer 112 could be, for example, LPCVD silicon oxide or a plasma-enhanced chemical vapor deposited (PECVD) Oxynitride (each of these deposition techniques involve relatively low temperatures that will not melt or otherwise damage the thin film transfer heating element 60). This resulting intermediate structure is shown in FIG. 7D. Sensor heating element 62 is then formed on dielectric layer 112 upper surface 114 in a desired pattern with a desired material using a conventional thin film formation process (see FIG. 7E).

It should be noted that in the preferred embodiment FIG. 7 structure the transfer heating element 60 is provided at the bottom of the resulting vertical element stack and that the sensor heating element 62 is provided at the top of the stack. However, since the thermal coupling between elements 60, 62 is excellent and since all of diaphragm 92 (including all structures formed thereon) tend to be at substantially the same temperature under any fluid flow condition, it may not matter, for purposes of thermal contact with the fluid flow, which of elements 60, 62 is on top of the other. However, it may be important due to other considerations (e.g., relative size of one of the heating elements 60, 62 with respect to the other, minimizing damage to one of the heating elements by forming it later in the fabrication process and thus exposing it to a minimum number of subsequent process steps, etc.). The present invention is not limited to providing transfer heating element 60 on the bottom of the stack and sensor heating element 62 on the top of the stack.

In the case of either the FIG. 5 interlaced structure 52a or the FIG. 7 stacked sensor structure 52b, any exposed resistive heating elements are covered with a passivation layer 116 (comprising, e.g., PECVD oxynitride film). See FIGS. 5D and 7F. Some parts of passivation layer 116 may then be removed (or masking techniques may be employed to prevent the passivation layer from forming in certain areas) to provide exposed portions of elements 60, 62 for pad bonding. Finally, an anisotropic silicon etching solution may be used to etch away selected portions of the "backside" of silicon substrate 90 so as to form diaphragm window 100 (see FIG. 5E; 7G).

FIG. 6 and 6C are schematic diagrams of an exemplary resulting "stacked" configuration produced in accordance with the FIG. 7A–7G fabrication technique. FIGS. 6 and 6C are schematic in that they do not show the insulating layers 114, 116 so as to better show the exemplary registration between the underlying polysilicon layer 60 and the overlying metal layer 62. In the preferred embodiment, pads 204, 205 are gold interconnects to poly silicon layer 60 disposed substantially in the center of diaphragm 92. Pads 203, 206 are connected to a gold element 62 which lies on top of element 60 (elements 60, 62 are separated by a thermal $SiO_2$ layer 114 not shown in FIGS. 6, 6C). Pads 207, 208 connect cold element 58 which is gold in the preferred embodiment.

While the invention has been described with respect to what is presently regarded as the most practical embodiments thereof, it will be understood by those of ordinary skill in the art that various alterations and modifications may be made which nevertheless remain within the scope of the invention as defined by the claims which follow.

What is claimed is:

1. A fluid flow sensor system having a silicon substrate, a doped silicon boundary means on one surface of the substrate defining an enclosed area on the substrate and providing thermal isolation between the substrate and the enclosed area; a dielectric layer extending over the one surface of the substrate and the doped silicon boundary means, the layer having two layers of silicon oxide sandwiching a layer of silicon nitride, one of the silicon oxide layers on the one surface of the substrate; window means extending through the substrate bounded by the boundary means and enclosed at one end by the layer forming a diaphragm over the window means; the sensor system characterized in that a thin film, self-heating, transfer heating element formed on the diaphragm, said heating element being connected with a constant current source to heat and maintain the diaphragm at a predetermined temperature above ambient;

a thin film, self-heating, sensor heating element formed on the diaphragm, said thin film sensor heating element being at substantially the same temperature as said predetermined temperature due to the heat conducted from said heating element; and feedback current supplying means connected to said sensor element to supply a first current to bring said sensor element to said predetermined temperature in the absence of fluid flow across said sensor and to supply a second current to said element to raise its temperature to said predetermined temperature in the presence of fluid across said sensor element, said second current is proportional to the amount of fluid flow across said sensor.

2. A fluid flow sensor structure as in claim 1 wherein said transfer heating element and said sensor heating element are vertically stacked one overlying the other having an electrically insulating layer disposed therebetween.

3. A fluid flow sensor structure as in claim 2 wherein said sensor heating element is disposed to overlie said transfer heating element.

* * * * *